(12) United States Patent
Huang

(10) Patent No.: US 7,151,012 B2
(45) Date of Patent: *Dec. 19, 2006

(54) REDISTRIBUTION LAYER OF WAFER AND THE FABRICATING METHOD THEREOF

(75) Inventor: Min-Lung Huang, Kaohsiung (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/183,494

(22) Filed: Jul. 18, 2005

(65) Prior Publication Data

US 2006/0073693 A1 Apr. 6, 2006

(30) Foreign Application Priority Data

Oct. 6, 2004 (TW) .............................. 93130283 A

(51) Int. Cl.
*H01L 21/00* (2006.01)

(52) U.S. Cl. ............... 438/108; 257/778; 257/738; 438/106; 438/119; 438/613

(58) Field of Classification Search ............... 438/108, 438/106, 119, 613; 257/738, 778

See application file for complete search history.

(56) References Cited

U.S. PATENT DOCUMENTS 6,492,198 B1 * 12/2002 Hwang ...................... 438/108

\* cited by examiner

*Primary Examiner*—Brook Kebede
*Assistant Examiner*—Su C. Kim
(74) *Attorney, Agent, or Firm*—Thomas, Kayden, Horstemeyer & Risley

(57) ABSTRACT

A wafer comprises a wafer, a conductor, a first passivation layer, a second passivation layer, a redistribution layer, and a third passivation layer. The conductor is disposed on the wafer. The first passivation layer covers the wafer, and exposes the surface of the conductor. The second passivation layer having an aperture is formed on the first passivation layer, and the aperture relatively to a pre-designed line exposes the surface of the conductor. The redistribution layer comprising a first and second metallic layer is formed in the aperture. The first metallic layer is disposed in the aperture. The second metallic layer peripherally covers the first metallic layer, and is connected to the inner wall of the aperture formed by the first passivation layer, second passivation layer and the conductor. The third passivation layer is formed on the second passivation layer and the first metallic layer of the redistribution layer.

11 Claims, 9 Drawing Sheets

REDISTRIBUTION LAYER OF WAFER AND THE FABRICATING METHOD THEREOF

This application claims the benefit of Taiwan Application Serial No. 093130283, filed Oct. 6, 2004, the subject matter of which is incorporated herein by reference.

BACKGROUND OF THE INVENTION

1. Field of the Invention

The invention relates in general to a redistribution layer structure of a wafer and the fabricating method thereof, and more particularly to a redistribution layer having two different metallic layers.

2. Description of the Related Art

Referring to FIG. 1, a cross-sectional view of a traditional wafer. The traditional wafer 10 includes a wafer 11, a conductor 14, a first passivation layer 13, a redistribution layer 14, a second passivation layer 15, a under bump metallurgy layer (UBM layer) 16, and a bump 17. The conductor, such as a pad 12, is disposed on the wafer 11. The first passivation layer 13 covers the wafer 11 and part of the pad 12, and exposes the surface of the pad 12. The redistribution layer 14 is formed on the first passivation layer 13 for electrically connecting to the pad 12 and UBM layer 16. The redistribution layer 14 is generally made from aluminum. The second passivation layer 15 is disposed on the redistribution layer 14 for protecting it. The UBM layer 16 is formed on one end of the redistribution layer 14 for helping connect the bump 17 to the redistribution layer 14. The bump 17 is formed on the UBM layer 16.

Referring to FIG. 2A~2H, cross sectional views showing a method for fabricating the traditional redistribution layer of a wafer. The method for fabricating the traditional redistribution layer includes several steps stated below. First, a wafer 11 having a pad 12 is provided as shown FIG. 2A. Then, a first passivation layer 13 is coated on the wafer 11 and part of the pad 12 as shown in FIG. 2B. The first passivation layer 13 exposes the surface 121 of the pad 12. Next, a patterned conductive layer 14a is formed on the first passivation layer 13 and the pad 12 as shown FIG. 2C. Then, a second passivation layer 15 is coated on the redistribution layer 14. An aperture 151 of the second passivation layer 15 is formed and exposes part of the redistribution layer 14 as shown in FIG. 2D. Afterward, a UBM layer 16 is formed in the aperture 151.

Next, a photoresist layer 181 covers the whole surface, and then a opening 182 is defined by patterning as shown in FIG. 2F. Then, the solder paste 19 is printed into the opening 182 as shown in FIG. 2G. Finally, the solder paste 19 is reflowed to forming the bump 17, and the patterned photoresist layer is removed. Thus, the wafer 10 is made.

However, the redistribution layer is easily detached from the passivation layer of the traditional wafer. It is difficult for the redistribution layer to tightly fasten on the first passivation layer, and that results in the failure of the wafer.

SUMMARY OF THE INVENTION

In view of the foregoing, it is an object of the present invention to provide a redistribution layer structure of a wafer and the fabricating method thereof. The redistribution layer of the invention has two different metallic layers; the outside metallic layer is made from anti-corroded metal, and well adheres to the passivation layer. The inside metallic layer is made from metal with good conductivity. Thus, the redistribution layer owns both advantage of excellent conductivity and firm adherence to the passivation layer.

The invention achieves the above-identified object by providing a method for fabricating a redistribution layer of the wafer, comprising steps of: (a). providing a wafer having a conductor and a first passivation layer, the first passivation layer covering part of the wafer and exposing the surface of the conductor; (b). forming a second passivation layer on the first passivation layer; (c). forming an aperture relative to a pre-designed line by selectively removing part of the second passivation layer, the surface of the conductor exposed through the aperture; (d). forming a redistribution layer in the aperture, wherein the center of the redistribution layer comprises a first metal layer in the center and a second metallic layer, peripherally covering the first metallic layer and connected to the inner wall of the aperture formed by the first passivation layer, the second passivation layer, and the conductor; and (e). forming a third passivation layer on the second passivation layer and the redistribution layer.

It is another object of the invention to provide a method for fabricating a wafer, comprising steps of: (a). providing a wafer having a conductor and a first passivation layer, the first passivation layer covering part of the wafer and exposing the surface of the conductor; (b). forming a second passivation layer on the first passivation layer; (c). forming an aperture relative to a pre-designed line by selectively removing part of the second passivation layer, the surface of the conductor exposed through the aperture; (d). forming a redistribution layer in the aperture, wherein the center of the redistribution layer comprises a first metal layer in the center and a second metallic layer, peripherally covering the first metallic layer and connected to the inner wall of the aperture formed by the first passivation layer, the second passivation layer, and the conductor; (e). forming a third passivation layer on the second passivation layer and the redistribution layer; (f). selectively removing part of the third passivation layer to form a opening for exposing part of the redistribution; (g). forming a under bump metallurgy (UBM) layer on the third passivation layer and the opening; and (h). forming a bump on the UBM layer.

It is another object of the invention to provide a redistribution layer of a wafer for electrically connecting a conductor and a under bump metallurgy layer (UBM layer). The redistribution layer comprises a first metallic layer and a second metallic layer. The second metallic layer is made from an anti-corroded metal, and peripherally covering the first metallic layer.

It is another object of the invention to provide a wafer. The wafer comprises a wafer, a conductor, a first passivation layer, a second passivation layer, a redistribution layer, and a third passivation layer. The conductor is disposed on the wafer. The first passivation layer covers the wafer and part of the conductor, and exposes the surface of the conductor. The second passivation layer having an aperture is formed on the first passivation layer, and the aperture relatively to a pre-designed line exposes the surface of the conductor. The redistribution layer comprising a first and second metallic layer is formed in the aperture. The first metallic layer is disposed in the aperture. The second metallic layer peripherally covers the first metallic layer, and is connected to the inner wall of the aperture formed by the first passivation layer, second passivation layer and the conductor. The third passivation layer is formed on the second passivation layer and the first metallic layer of the redistribution layer.

Other objects, features, and advantages of the invention will become apparent from the following detailed description of the preferred but non-limiting embodiments. The following description is made with reference to the accompanying drawings.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 1:
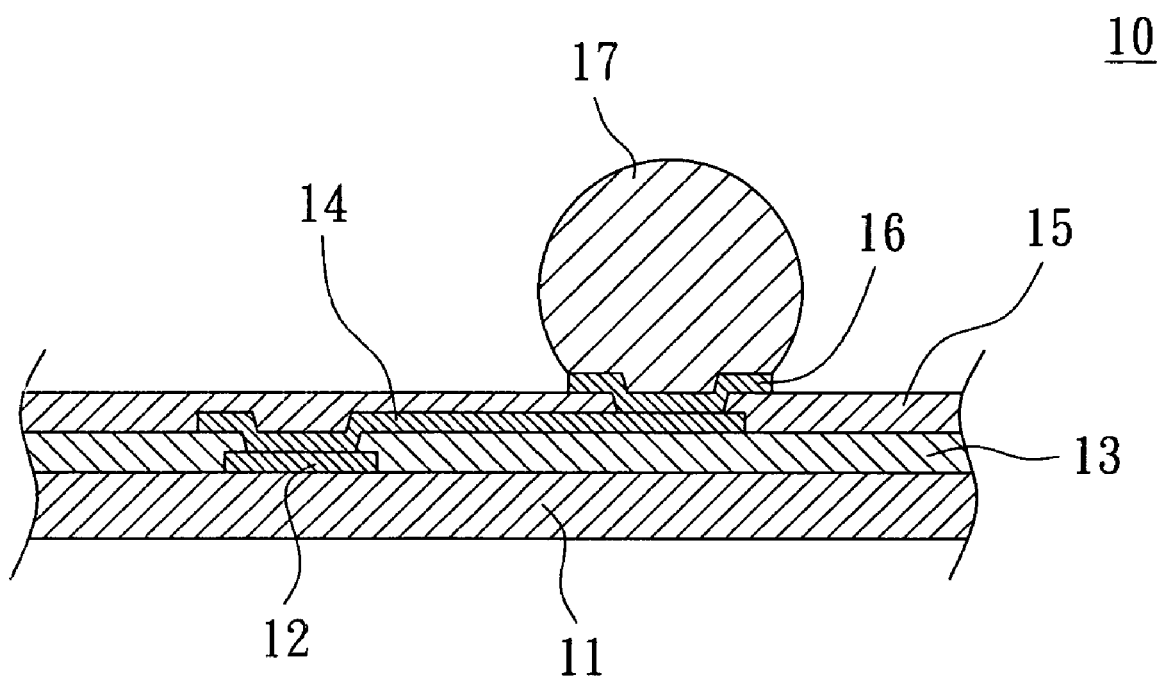
FIG. 1 is a cross-sectional view of a traditional wafer.
Figure 2A:
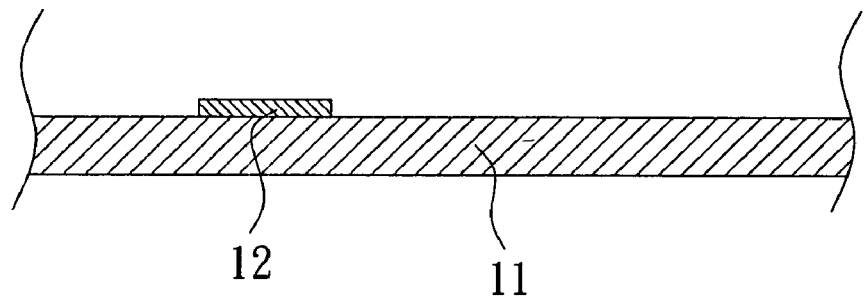
FIG. 2A~2H are cross sectional view showing a method for fabricating the traditional redistribution layer of a wafer.
Figure 2B:
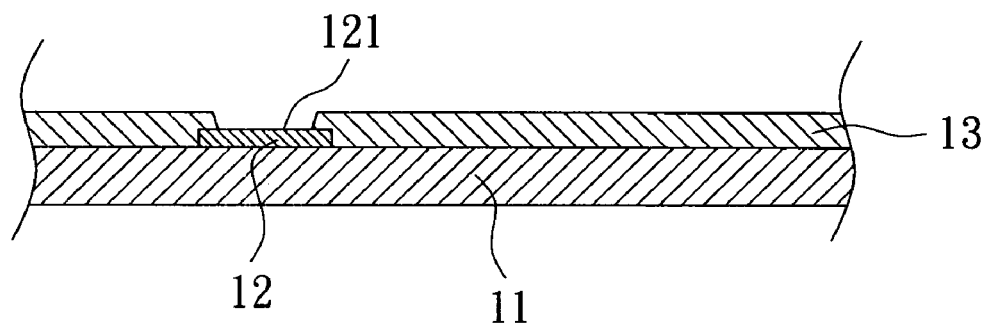
Figure 2C:
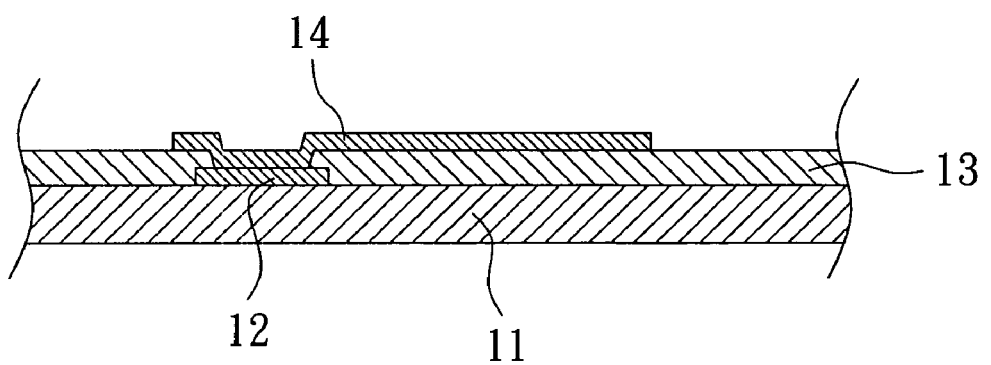
Figure 2D:
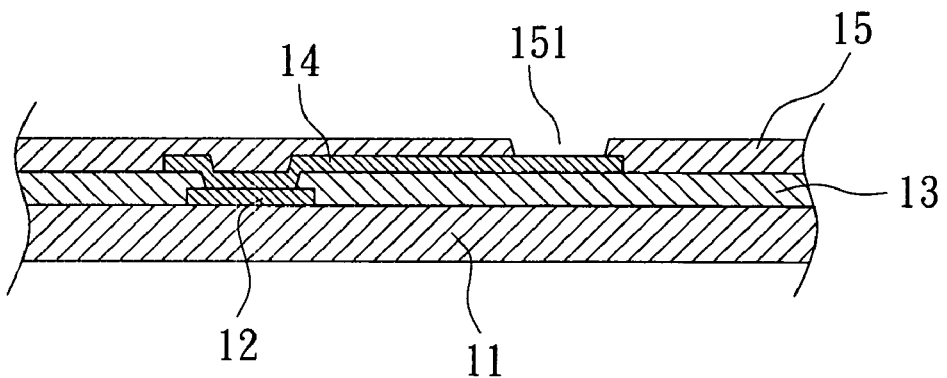
Figure 2E:
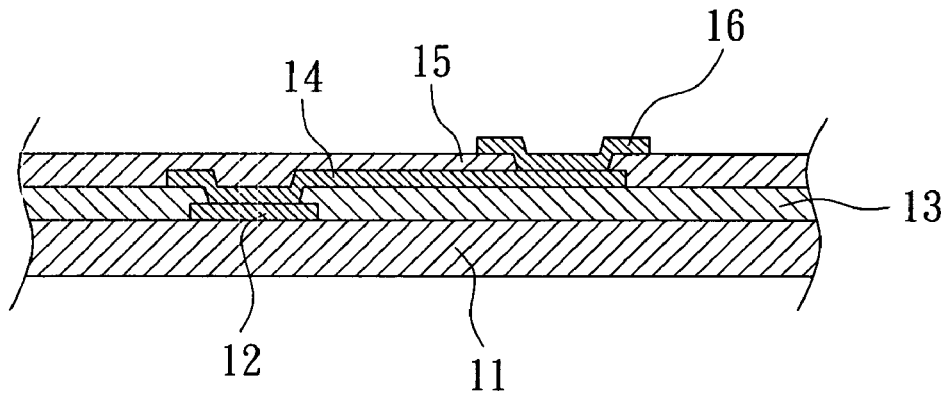
Figure 2F:
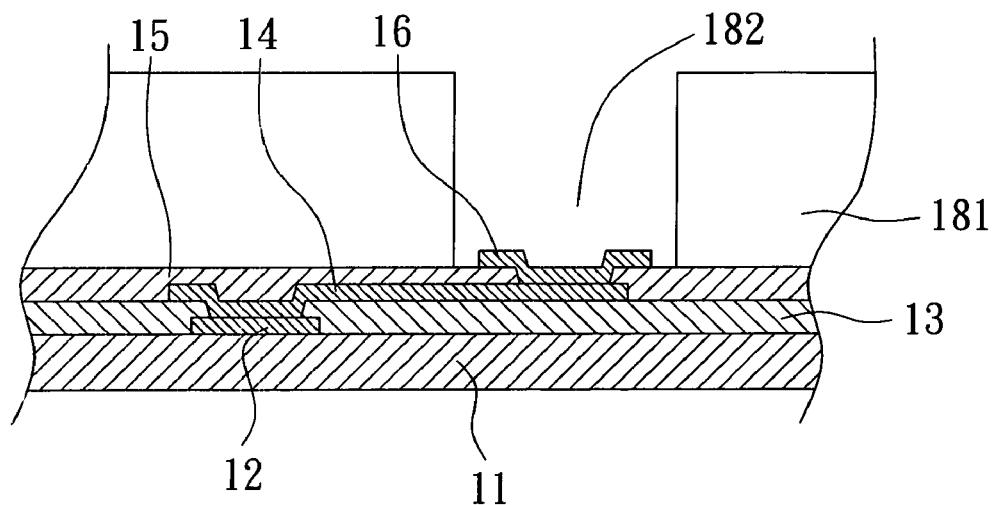
Figure 2G:
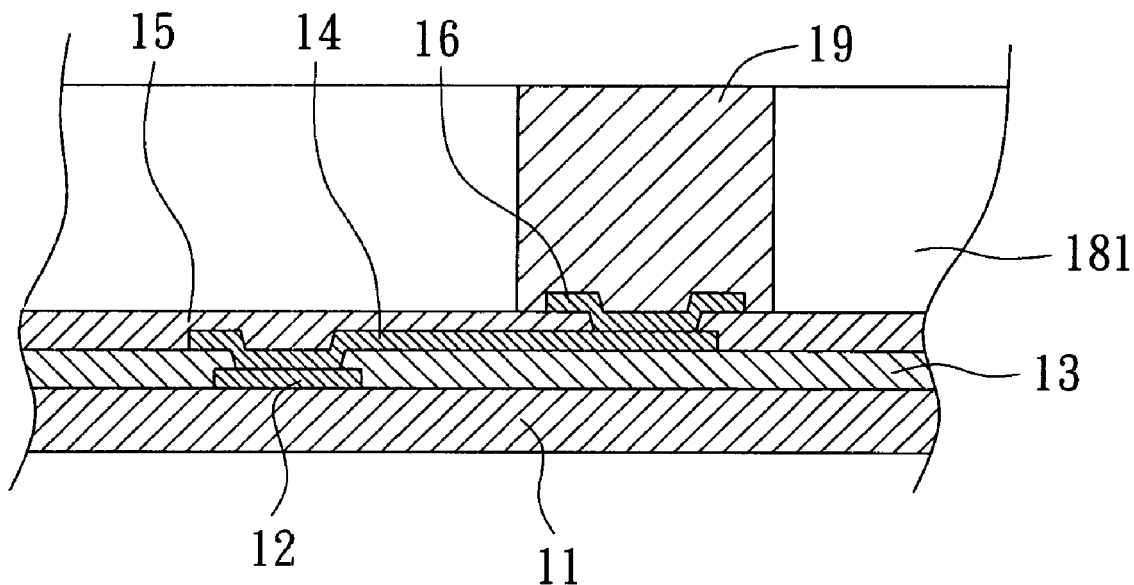
Figure 2H:
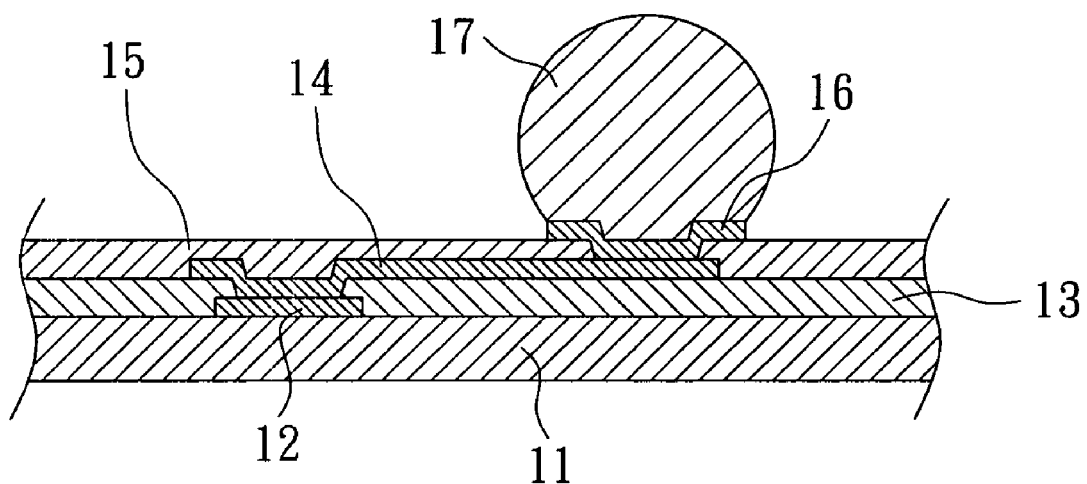
Figure 3A:
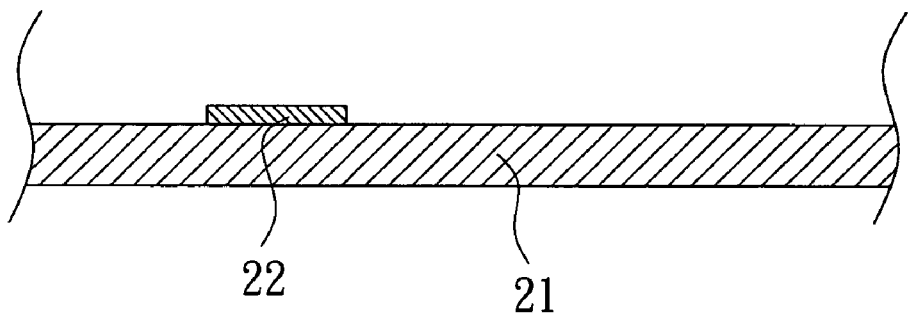
FIG. 3A~3S are cross sectional views illustrating the method for fabricating the wafer according to the preferred embodiment of the present invention.
Figure 3B:
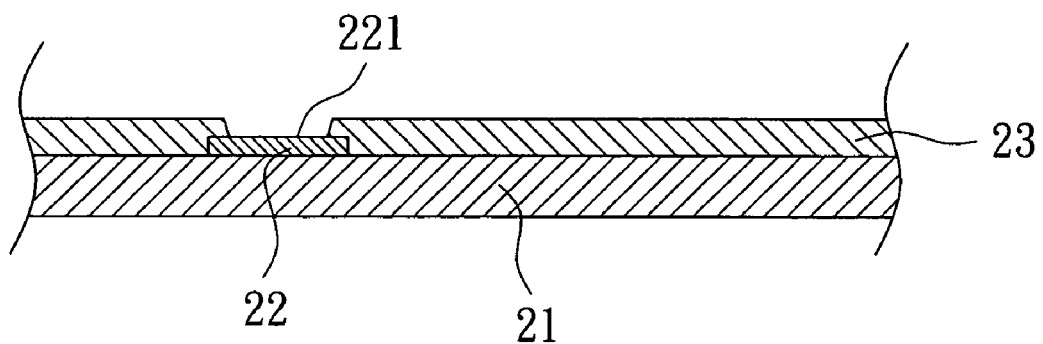
Figure 3C:
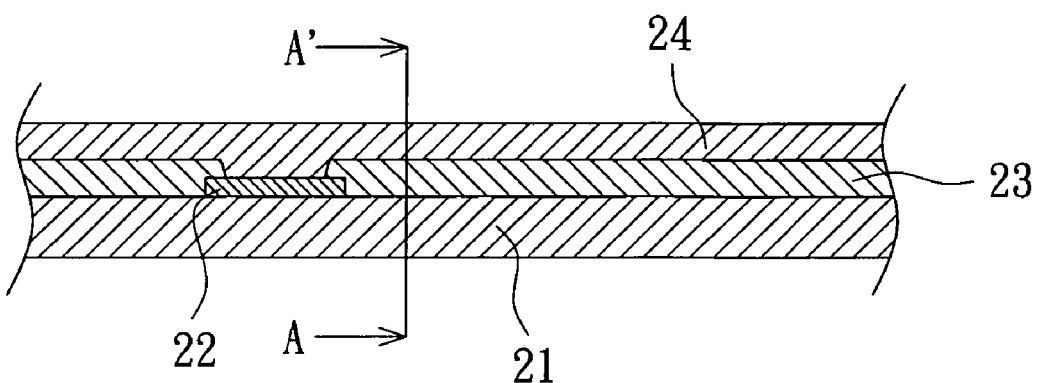
Figure 3D:
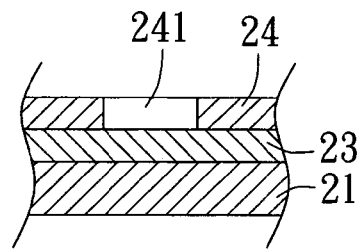
Figure 3H:
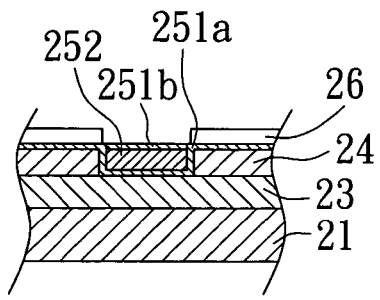
Figure 3E:
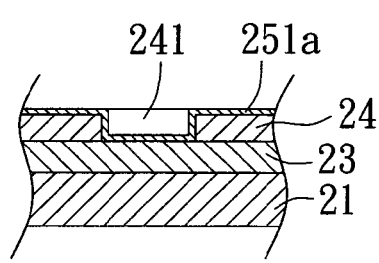
Figure 3I:
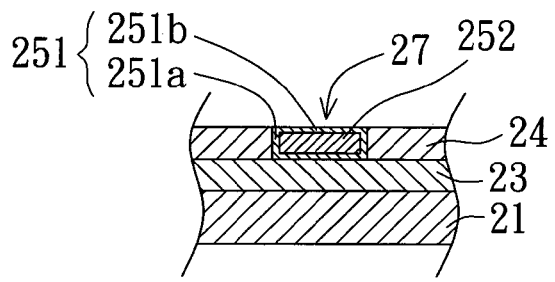
Figure 3F:
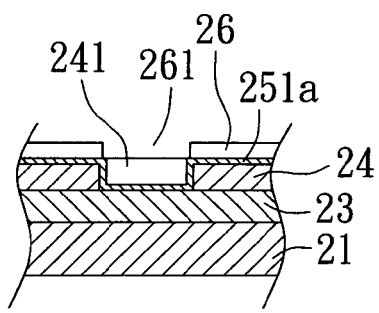
Figure 3J:
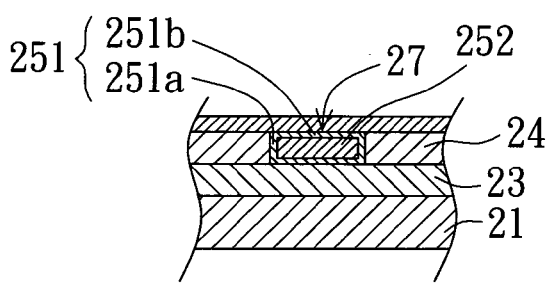
Figure 3G:
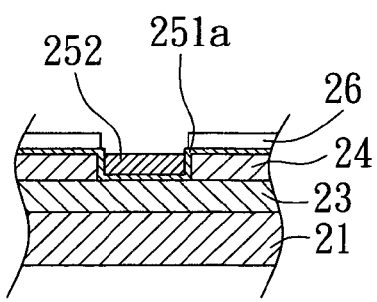
Figure 3K:
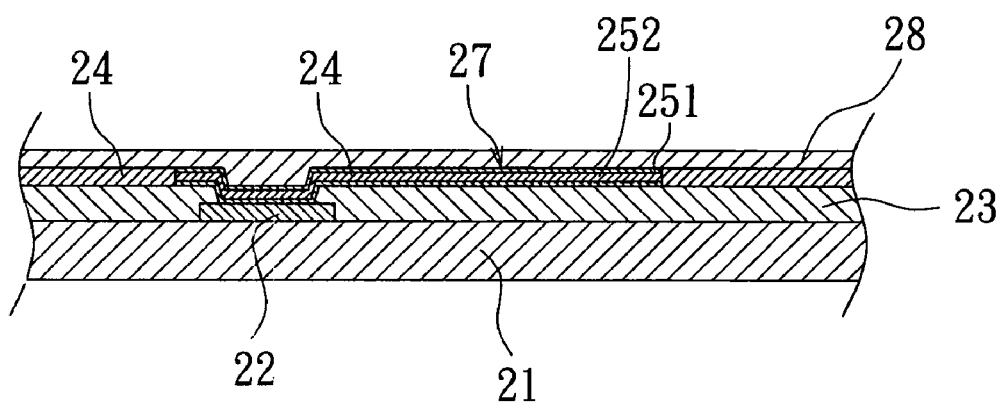
Figure 3L:
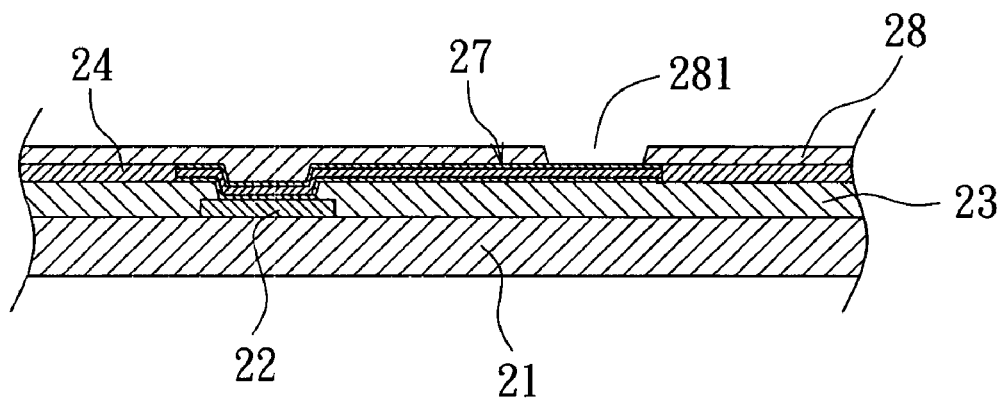
Figure 3M:
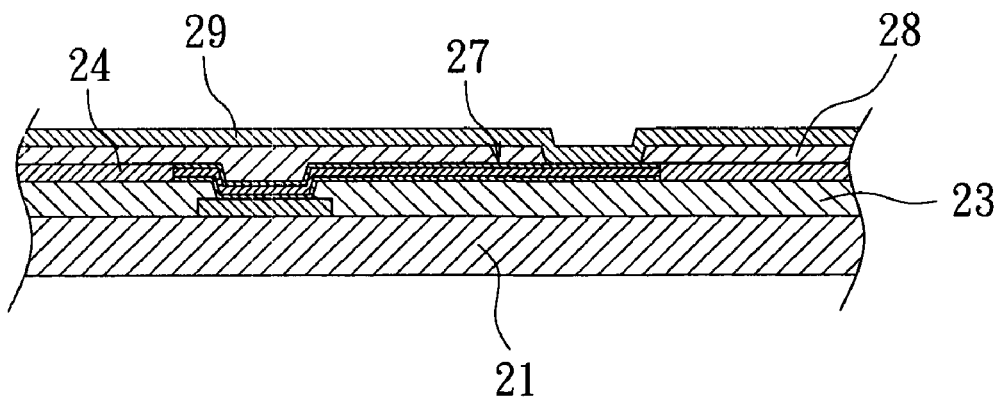
Figure 3N:
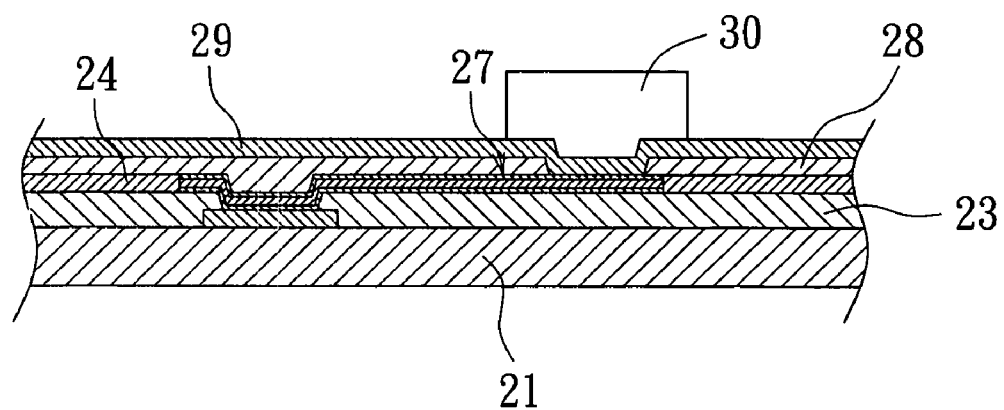
Figure 3O:
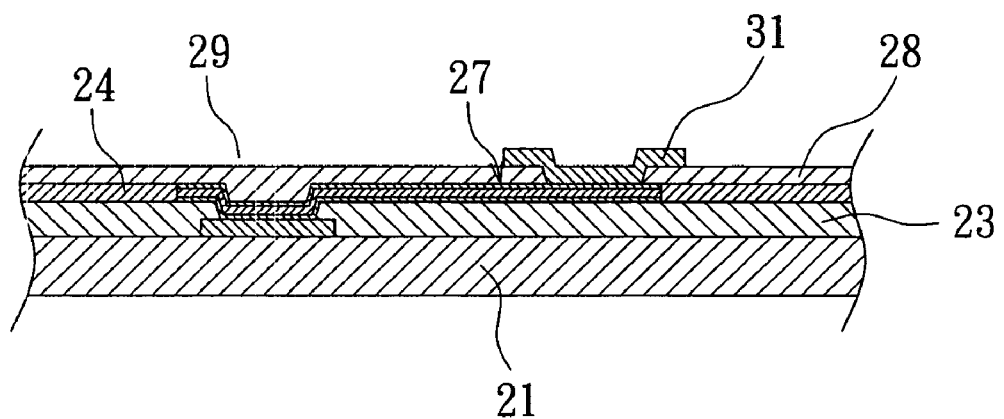
Figure 3P:
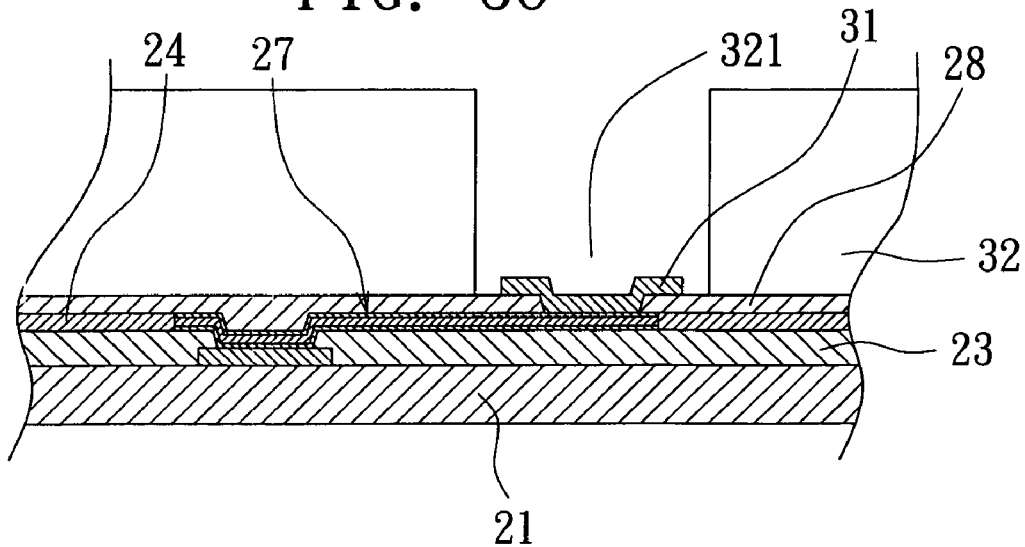
Figure 3Q:
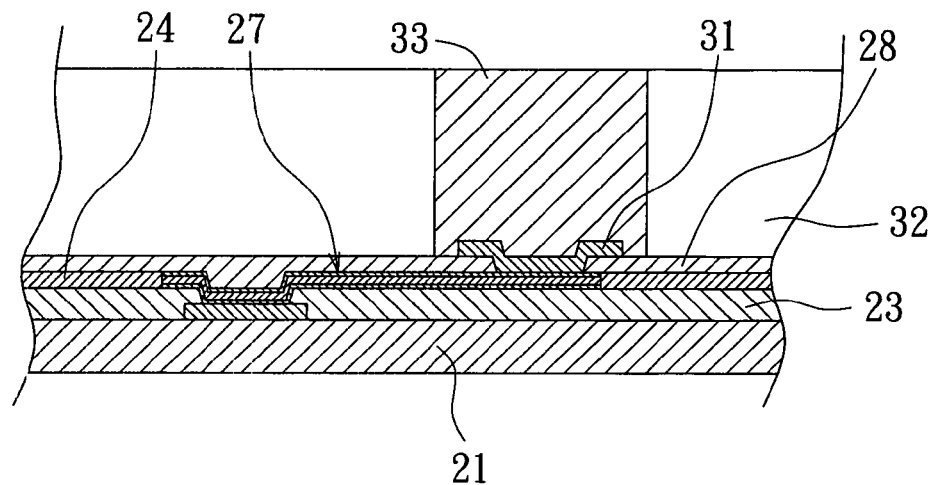
Figure 3R:
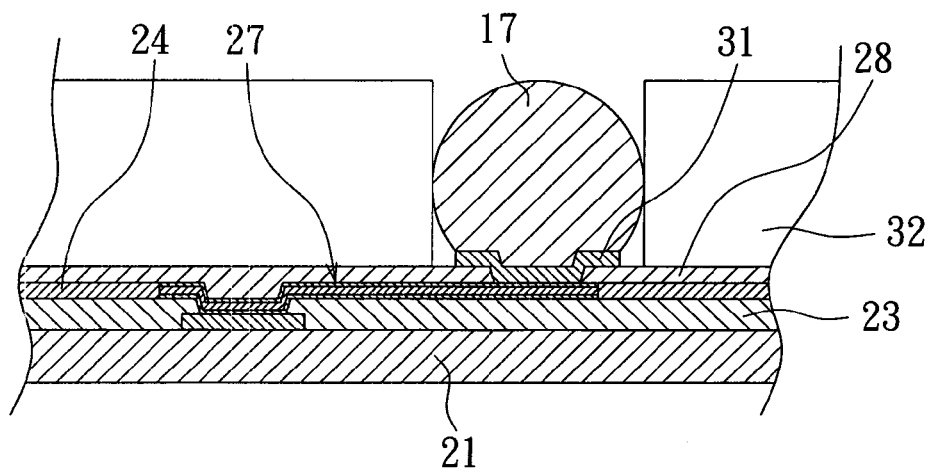

Referring to FIG. 3A~3R, these are cross sectional view illustrating the method for fabricating the wafer according to the preferred embodiment of the present invention. The method includes steps as follow. Firstly, a wafer 21 having conductor 22, such as pad, is provided as shown in FIG. 3A. Alternately, a first passivation layer 23 is formed on the wafer 21 by coating, and exposes part of the surface 221 of the conductor 22 as shown in FIG. 3B. Next, a second passivation layer 24 is formed on the first passivation layer 23, and covers the whole conductor 22 as shown in FIG. 3C.

FIG. 3D~3I are cross sectional view of the wafer taken along line A–A' in FIG. 3C. Further, part of the second passivation layer 24 is selectively removed through exposure process in order to form an aperture 241 in the pre-designed line on the wafer as shown in FIG. 3D. The surface 221 of the conductor 22 is exposed via one end of the aperture 241. Next, a lower metal layer 251a is formed on the side wall of the aperture 241. For example, the lower metal layer 251a is formed by electroplating, sputtering, electro-less plating or other chemically and physically deposit method. Afterward, a photoresist layer 26, such as a dry film or liquid photoresist, is formed on the lower metal layer 251a, and then an opening 261 is formed on the photoresist layer 26 relatively to the aperture 241 to expose the lower metal layer 251a in the aperture 241 as shown in FIG. 3F. Alternatively, a first metallic layer 252 is formed on the lower metal layer 251a in the aperture 241 as show n in FIG. 3G. Preferably, the first metallic layer 252 is formed by electroplating process. The upper metal layer 251b is formed on the first metallic layer 252 to fill the aperture 241 as shown in FIG. 3H. Next, the photoresist layer 26 is removed, and then the excess metal material of the redistribution layer is etched. Thus, the top surface of the redistribution layer 27 and the second passivation layer 28 are at the same plane. It is noted that the lower metal layer 251a and the upper metal layer 251b constitute the second metallic layer 251.

The redistribution layer is embedded in the second passivation layer 28. The lower metal layer 251a, the first metallic layer 252, and the upper metal layer 251 constitute the redistribution layer of the wafer. The center of the redistribution layer is made from the first metallic layer 252, and the peripheral redistribution layer is made from the second metallic layer 251. The second metallic layer 251 peripherally covers the first metallic layer 252, and connects to the inner wall of the aperture 241 which is constituted by the first passivation layer 23, the second passivation layer 24, and the conductor 22. The lower and upper metal layer 251a and 251b, equal to the second metallic layer 251, are made from an anti-corroded metal, such as titanium (Ti), Thus, less oxidation occurs on the second metallic layer 251, and little metallic oxides produced on the interface between the second metallic layer 251 and the passivation layers 23 and 24 prevents the redistribution layer from detachment. The first metallic layer 252 is made from a metal with good conductivity, such as copper (Cu) or aluminum (Al), which can enhance conductivity in the wafer and prevent the voltage-drop problem.

Further, a third passivation layer 28 is formed on the second passivation layer 24 and the redistribution layer 27.

The angle of view in FIG. 3K~3S is changed, but remains the same as that in FIG. 3A. FIG. 3K and FIG. 3J shows the same structure but with different visual angle.

Further, part of the third passivation layer 28 is selectively removed through exposure process to generate a opening 281 for exposing part of the redistribution layer 27, as shown in FIG. 3L. Then, a conductive layer 29 is formed on the third passivation layer 28 as shown in FIG. 3M. The conductive layer 29 is preferably formed by sputter process.

Next, a photoresist layer, such as dry film or liquid photoresist, is formed on the conductive layer 29. The photoresist layer is selectively removed, and a patterned photoresist layer 30 remains on the opening 281 as shown in FIG. 3N. The conductive layer 29 is removed, such as by wet-etched process, according to the patterned photoresist layer 30 as shown in FIG. 3O. The part of the conductive layer 29 is removed, and the patterned conductive layer on the opening 281 and the third passivation layer 28 becomes under bump metallurgy layer (UBM layer) 31. After that, the patterned photoresist layer 30 is removed.

Figure 3S:
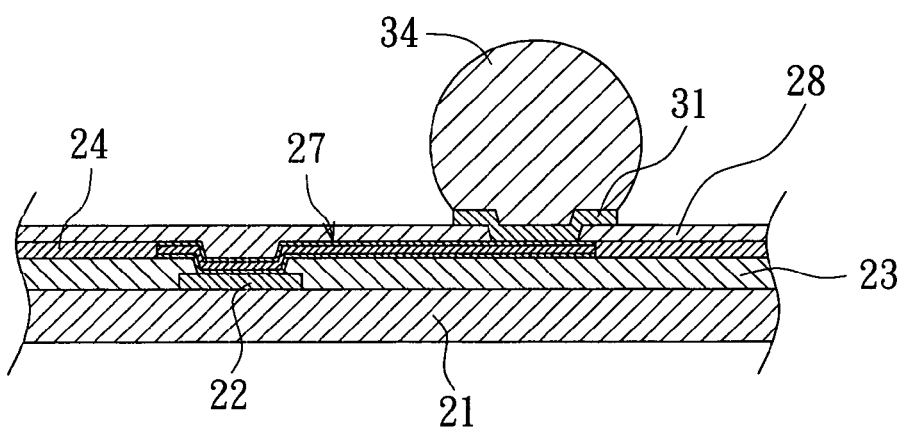

Further, another photoresist layer 32 is formed on the whole surface, and patterned to form a opening 321 as shown in FIG. 3P. Next, a solder paste is filled with the opening 321, preferably through printing process as shown in FIG. 3Q. Alternatively, the solder paste 33 is reflowed, so that the bump 34 is formed on the UBM layer 31. Finally, the photoresist layer 32 is removed, and the wafer 20 is completed as shown in FIG. 3S.

Referring to FIG. 3R, it is a cross sectional view of the wafer in accordance with the preferred embodiment of the invention. The wafer 20 of the preferred embodiment includes a wafer 21, conductor 22, the first passivation layer 23, the second passivation layer 24, the redistribution layer 27, the third passivation layer 28, a under bump metallurgy layer (UBM layer) 31 and the bump 34. The conductor 22, such as pad, is disposed on the wafer 21. The first passivation layer 23 covers the wafer 21 and part of the conductor 22, and exposes the surface of the conductor 22. The second passivation layer 24 having an aperture is formed on the first passivation layer 23, and the aperture relatively to a pre-designed line exposes the surface of the conductor 22. The redistribution layer 27 comprising a first and second metallic layer 252 and 251 is formed in the aperture. The first metallic layer 252 is disposed in the aperture. The second metallic layer 251 peripherally covers the first metallic layer 252, and is connected to the inner wall of the aperture formed by the first passivation-layer 23, second passivation layer 24 and the conductor 22. The third passivation layer 28 is formed on the second passivation layer 24 and the first metallic layer 252 of the redistribution layer 27. In addition, the material of the first, second, and third passivation layer 23, 24 and 28 is selected from the group of Benzocyclobutene (BCB) and Polyimide (PI). The under bump metallurgy layer (UBM layer) 31 is formed on the third passivation layer 28, and is electrically connected to the redistribution layer 27. The bump 34 is formed on the UBM layer 31. Preferably, the bump 34 comprises aluminum.

Further, the top surface of the redistribution layer 27 and the second passivation layer 24 are at the same plane. In addition, the first metallic layer is made from a metal with good conductivity, such as aluminum (Al) or copper (Cu). The second metallic layer is made from an anti-corroded metal, such as titanium (Ti).

As described hereinbefore, the redistribution layer of the wafer and the fabricating method thereof has many advantages. The redistribution layer having double metallic layer is embedded in the passivation layer. The inside redistribution layer is made from the metal with excellent conductivity, which can enhance conductivity in the wafer and prevent the voltage-drop problem. The outside redistribution layer is made from the anti-corroded metal, which can improve the adherence to the passivation layer. Further, the redistribution layer is embedded in the passivation layer. It allows to enforce the connection between the redistribution layer and the passivation layer. Thus, the redistribution layer has both advantages of tightly adherence and excellent conductivity.

While the invention has been described by way of example and in terms of a preferred embodiment, it is to be-understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for fabricating a redistribution layer of a wafer, comprising steps of:
   providing a wafer having a conductor and a first passivation layer, the first passivation layer covering part of the wafer and exposing the surface of the conductor;
   forming a second passivation layer on the first passivation layer;
   forming an aperture relative to a pre-designed line by selectively removing part of the second passivation layer, the surface of the conductor exposed through the aperture;
   forming a lower metal layer in the aperture and on the second passivation layer;
   forming a photoresist layer on the lower metal layer;
   forming an opening on the photoresist layer relatively to the aperture to expose the lower metal layer in the aperture;
   forming a first metallic layer on the lower metal layer in the aperture;
   forming a upper metal layer to fill the aperture and cover on the first metallic layer, the lower metal layer and the upper metal layer constituting the second metallic layer, whereby a redistribution layer is formed in the aperture, and the redistribution layer comprises a first metal layer in the center and a second metallic layer, peripherally covering the first metallic layer and connected to the inner wall of the aperture formed by the first passivation layer, the second passivation layer, and the conductor; and
   forming a third passivation layer on the second passivation layer and the redistribution layer.

2. The method according to claim 1, wherein the step of forming the redistribution layer in the aperture further comprising:
   removing the photoresist layer;
   etching back the redistribution layer, so that the top surface of the redistribution layer and the second passivation layer are at the same plane.

3. The method according to claim 1, wherein the photoresist layer is a dry film.

4. The method according to claim 1, wherein the lower metal layer is formed by sputtering.

5. The method according to claim 1, wherein the lower metal layer is formed by electro-less plating.

6. The method according to claim 1, wherein the first metallic layer is electroplating a metallic layer on the lower metal layer.

7. The method according to claim 1, wherein the first metallic layer comprises aluminum.

8. The method according to claim 1, wherein the first metallic layer comprises copper.

9. The method according to claim 1, wherein the second metallic layer is made from an anti-corroded metal.

10. The method according to claim 1, wherein the second metallic layer comprises titanium.

11. The method according to claim 1, wherein the material of the first, second, and third passivation layer is selected from the group of Benzocyclobutene (BCB) and Polyimide (PI).

* * * * *